United States Patent [19]

Kopel

[11] 4,184,094

[45] Jan. 15, 1980

[54] COUPLING FOR A FOCUSED ULTRASONIC TRANSDUCER

[75] Inventor: LeRoy Kopel, Tempe, Ariz.

[73] Assignee: Advanced Diagnostic Research Corporation, Tempe, Ariz.

[21] Appl. No.: 911,524

[22] Filed: Jun. 1, 1978

[51] Int. Cl.$^2$ .................... H01L 41/10

[52] U.S. Cl. .................... 310/335; 128/660; 310/327; 310/369; 310/371; 367/152

[58] Field of Search .................... 310/327, 334, 335, 369, 310/371; 340/8 L, 8 MM, 10; 128/24, 2 L; 73/632, 642, 644

[56] References Cited

U.S. PATENT DOCUMENTS

| | | | |
|---|---|---|---|
| 2,549,872 | 4/1951 | Willard | 310/371 X |
| 2,565,159 | 8/1951 | Williams | 310/371 X |
| 2,913,602 | 11/1959 | Joy | 310/335 X |
| 3,278,771 | 10/1966 | Fry | 310/335 X |
| 3,663,842 | 5/1972 | Miller | 310/335 X |
| 3,958,559 | 5/1976 | Glenn et al. | 310/335 X |
| 3,958,559 | 5/1976 | Glenn et al. | 310/335 X |
| 3,968,680 | 7/1976 | Vopilkin et al. | 310/369 X |
| 3,979,565 | 9/1976 | McShane | 310/335 X |
| 4,001,766 | 1/1977 | Hurwitz | 310/335 X |
| 4,016,530 | 4/1977 | Goll | 310/335 X |
| 4,092,867 | 6/1978 | Matzuk | 73/642 X |

FOREIGN PATENT DOCUMENTS

| | | | |
|---|---|---|---|
| 912183 | 12/1962 | United Kingdom | 310/335 |

OTHER PUBLICATIONS

ZnO Film Concave Transducer for Focusing Microwave Ultrasound, by N. Chubachi, *Electronics Letters*, vol. 12, No. 22, pp. 595–596, Oct. 1976.

*Primary Examiner*—Mark O. Budd
*Attorney, Agent, or Firm*—Christie, Parker & Hale

[57] ABSTRACT

A piezoelectric crystal has a concave active surface and a high acoustical impedance. A flat layer of molded material having a low acoustical impedance faces the active surface of the crystal to form a space therebetween. An intermediate layer of molded material having an intermediate acoustical impedance fills the space between the crystal and the flat layer. Preferably, the intermediate material has a sonic velocity near that of water, and the flat layer has a uniform thickness of approximately ¼ of the average wavelength of the ultrasonic energy emitted by the crystal. A housing supports the crystal, the flat layer, and the intermediate layer.

16 Claims, 1 Drawing Figure

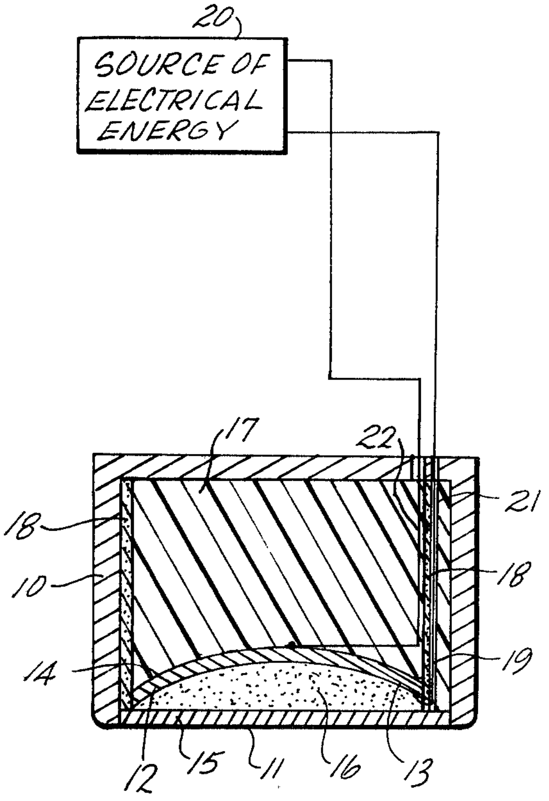
20
SOURCE OF
ELECTRICAL
ENERGY
17
22
21
18
10
18
14
19
12
15
11
16
13

COUPLING FOR A FOCUSED ULTRASONIC TRANSDUCER

BACKGROUND OF THE INVENTION

This invention relates to improvements in focused ultrasonic transducers, and more particularly to an ultrasonic transducer providing efficient energy transfer without defocusing the ultrasonic beam.

To couple focused ultrasonic energy into an interrogated object having a relatively flat surface, it is conventional to employ a piezoelectric crystal having a concave active surface and a filler such as mica-loaded epoxy, between the active surface and the object. The filler has a convex surface and a flat surface through which the ultrasonic energy is coupled from the crystal to the object. The filler has an acoustical impedance between that of the crystal and that of the object to provide an impedance match, but has a large sonic velocity relative to water. As a result of the large sonic velocity, when the interrogated object is water or body tissue, the filler defocuses the coupled ultrasonic energy. Consequently, a shorter curvature must be formed on the concave active surface to compensate for the defocusing effect, which makes manufacturing more difficult.

SUMMARY OF THE INVENTION

According to the invention, focused ultrasonic energy is coupled from a piezoelectric crystal having a concave active surface to an interrogated object by a layer of material filling the concavity of the crystal and forming a flat surface facing away from the concave surface of the crystal, the acoustical impedance of the material is between that of the crystal and that of the interrogated object, but substantially different from both, and the sonic velocity of the material is near that of the interrogated object.

A feature of the invention is a focused ultrasonic transducer for water or body tissue that comprises a piezoelectric crystal having a concave active surface and a high acoustical impedance and a flat layer of material having a low acoustical impedance and facing the active surface of the crystal to form a space therebetween. An intermediate layer of material having an acoustical impedance between that of the crystal and that of the flat layer fills a space between the crystal and flat layer. The intermedite layer has a sonic velocity near that of water and an acoustical impedance optimizing transfer of ultrasonic energy between the crystal and the water or body tissue. The intermediate layer and the flat layer together comprise the coupling layer described in the preceding paragraph.

BRIEF DESCRIPTION OF THE DRAWING

The features of a specific embodiment of the best mode contemplated of carrying out the invention are illustrated in the drawing, the single FIGURE of which is a side-sectional view of an ultrasonic transducer incorporating the principals of the invention.

DETAILED DESCRIPTION OF THE SPECIFIC EMBODIMENT

In the drawing, is shown an ultrasonic transducer suitable for coupling focused ultrasonic energy into body tissue or water, both of which have approximately the same ultrasonic properties, namely, sonic velocity and acoustical impedance. A housing 10 has an open end 11 adjacent to which a piezoelectric crystal 12 lies within housing 10. Crystal 12 has approximately uniform thickness, a concave surface on which a thin layer 13 of conductive material is deposited or bonded, and a convex surface on which a thin layer 14 of conductive material is deposited or bonded. The concave surface of crystal 12 faces open end 11. A flat layer 15 of molded material extends across open end 11 of housing 10 to enclose completely transducer 12 in housing 10 and to form a space between layer 13 and layer 15. Layer 15 is positioned as close to crystal 12 as possible. An intermediate layer 16 of molded material fills the space between layers 13 and 15. Crystal 12 is backed by a button 17 inside housing 10. Button 17 is made of a suitable material to rigidize and absorb vibrations of crystal 12. One of many suitable materials for button 17 is disclosed in my U.S. Pat. No. 3,487,137. an electrically insulated barrier 18 lies between housing 10 and crystal 12, layer 16, and button 17. Barrier 18 could be eliminated if housing 10 is made of plastic or other insulative material. An electrical conductor 19 connected at one end to layer 13 and at the other end to one output terminal of a source 20 of electrical energy passes through a groove 21 in the outside of barrier 18 to the exterior of housing 10. An electrical conductor 22 connected at one end to layer 14 and at the other output terminal of source 20 extends through button 17 to the exterior of housing 10.

Crystal 12 could either be spherical, in which case the remaining described components have a cross section perpendicular to the drawing that is circular in shape, or cylindrical, in which case the remaining described components have a cross section perpendicular to the drawing that is rectangular in shape.

Crystal 12 is excited to ultrasonic emission by the electrical energy from source 20. The focused ultrasonic energy emitted by crystal 12 is coupled by layers 15 and 16 into body tissue or water the surface of which abuts layer 15.

The thickness of layer 15 is preferably $\frac{1}{4}$ of the wave length corresponding to the average or center frequency of the ultrasonic energy to further improve the efficiency of energy transfer. To achieve efficient ultrasonic coupling to the body tissue or water, materials are selected for layer 15 and 16 that have different acoustical impedances between that of crystal 12 and that of water, the acoustical impedance of the material of layer 16 being larger than that of the material of layer 15. To optimize the energy transfer from crystal 12 to the interrogated object, the impedance ratio between crystal 12 and layer 16, the impedance ratio between layer 16 and layer 15, and the impedance ratio between layer 16 and the interrogated object all equal the cubed root of the impedance ratio between crystal 12 and the interrogated object. By way of example, crystal 12 could be a lead zirconate titanate piezoelectric material sold by Vernitron Corporation under the designation PZT 5A and having an acoustical impedance of $35\times10^5$ gm/cm$^2$ sec. To optimize the ultrasonic energy transfer assuming the acoustical impedance of crystal 12 is $35\times10^5$ gm/cm$^2$ sec and the acoustical impedance of the interrogated object is $1.5\times10^5$ gm/cm$^2$sec, the impedance of the materials of layers 15 and 16 would be respectively $4.3\times10^5$ gm/cm$^2$ sec and $12.2\times10^5$ gm/cm$^2$ sec.

To minimize the defocusing of the ultrasonic energy, a material is selected for layer 16 that also has a sonic velocity near that of water. By way of example, the material of layer 16 could be tungsten-loaded epoxy. In one embodiment, commercially available tungsten powder sold by Sylvania under the grade designation M55, which has an average particle diameter of 55 microns and specific gravity of 19, was mixed with a commercially available unfilled epoxy. The tungsten powder was added to the unfilled epoxy until it began to separate out, the resulting mixture being about 90% by weight tungsten. This tungsten-filled epoxy has a sonic velocity of $1.6\times10^5$ cm/sec and an acoustical impedance of $12\times10^5$ gm/cm$^2$ sec.

By way of example, the material of layer 15 could be a conventional commercially available mica-loaded epoxy containing about 40% mica by weight. This mica-loaded epoxy material has a sonic velocity of $2.9\times10^5$ cm/sec and an acoustical impedance of $4.3\times10^5$ gm/cm$^2$ sec. In summary, the exemplary materials, tungsten-loaded epoxy and mica-loaded epoxy have respective acoustical impedances closely approximating the values for optimum energy transfer set forth above and tungsten-loaded epoxy has a sonic velocity near that of water.

Materials other than tungsten-loaded epoxy and mica-loaded epoxy can be employed so long as such materials have approximately the described acoustical properties. To vary the acoustical impedance of tungsten-loaded epoxy and mica-loaded epoxy, the proportion of tungsten or mica is changed—more tungsten or mica for higher impedance and vice versa. The tungsten proportion in epoxy can be increased above 90% by compaction with a centrifuge, or otherwise. Although it is preferable that the materials be moldable from the point of view of ease of manufacture, layers 15 and 16 could be formed by machining if desired. If it is desired to couple ultrasonic energy into an object having an acoustical impedance substantially different from that of water or to generate ultrasonic energy with a piezoelectric crystal having a different acoustical impedance, correspondingly different acoustical impedances for layers 15 and 16 would be selected. Similarly, if ultrasonic energy is coupled to an interrogated object having a different sonic velocity from that of water, a material is preferably selected for layer 16 having a sonic velocity near that of such object.

Depending upon the nature of the interrogated object, it might be desirable or necessary to employ a coupling fluid between the described transducer and the object.

Thus, the invention provides efficient transfer of focused ultrasonic energy to an object without appreciably defocusing the ultrasonic beam. The described embodiment of the invention is only considered to be preferred and illustrative of the inventive concept; the scope of the invention is not to be restricted to such embodiment. Various and numerous other arrangements may be devised by one skilled in the art without departing from the spirit and scope of this invention. For example, an electrical energy receiver could be coupled to the piezoelectric crystal alternately with a source of electrical energy, or insteand of such source, depending upon the mode of operation of the transducer.

I claim:

1. A focused ultrasonic transducer comprising:

a piezoelectric crystal having a concave active surface and an acoustical impedance substantially higher than that of water; and a coupling layer of material filling the concavity of the crystal and forming a flat surface facing away from the concave surface of the crystal, the acoustical impedance of the coupling layer being between that of the crystal and that of water but substantially higher than that of water, and the coupling layer having a sonic velocity near that of water.

2. The transducer of claim 1, in which the material is solid.

3. The transducer of claim 1, additionally comprising a flat layer of material abutting the flat surface of the coupling layer, the flat layer of material having an acoustical impedance between that of water and that of the coupling layer of material, the coupling layer forming an intermediate layer of material filling the space between the crystal and the flat layer.

4. The transducer of claim 3, in which the acoustical impedance ratio between the crystal and the material of the intermediate layer, the acoustical impedance ratio between the material of the intermediate layer and the material of the flat layer, and the acoustical impedance ratio between the material of the flat layer and water are all equal to the cubed root of the acoustical impedance ratio between the crystal and water.

5. The transducer of claim 3, in which the acoustical impedance of the crystal, the intermediate layer, and the flat layer is approximately 35, 12.2, and $4.3\times10^5$ gm/cm$^2$ sec, respectively.

6. The transducer of claim 3, in which the material of the intermediate layer is moldable.

7. The transducer of claim 4, in which the material of the flat layer is moldable.

8. The transducer of claim 3, in which the material of the intermediate layer is tungsten-loaded epoxy.

9. The transducer of claim 8, in which the material of the flat layer is mica-loaded epoxy.

10. The transducer of claim 3, in which the crystal emits ultrasonic energy having a given average wavelength and the flat layer has a uniform thickness of approximately $\frac{1}{4}$ the given wavelength.

11. The transducer of claim 1, additionally comprising a housing for supporting the crystal, the flat layer, and the intermediate layer.

12. The transducer of claim 3, in which the material of the intermediate layer and the material of the flat layer are both solid.

13. A method for efficiently transferring ultrasonic energy to or from an interrogated object, the method comprising the steps of:

coupling a source or receiver of electrical energy to a piezoelectric crystal having a concave active surface, and an acoustical impedance substantially higher than that of the interrogated object; and coupling ultrasonic energy between the active surface of the crystal and the surface of the object through a flat layer of a first material facing the active surface of the crystal to form a space therebetween and an intermediate layer of a second material filling the space between the crystal and the flat layer, the acoustical impedance of the first and second materials being between that of the crystal and that of the object, the acoustical impedance of the second material being between that of the first material and that of the crystal, and the sonic velocity of the second material being near that of the object.

14. The method of claim 3, in wiich the acoustical impedance ratio between the crystal and the material of the intermediate layer, the acoustical impedance ratio between the material of the intermediate layer and the material of the flat layer, and the acoustical impedance ratio between the material of the flat layer and the object are all equal to the cubed root of the acoustical impedance ratio between the crystal and the object.

15. The method of claim 14, in which the flat layer has a uniform thickness of approximately one quarter of the average wave length of the coupled ultrasonic energy.

16. A method for efficiently transferring ultrasonic energy to or from an interrogated object, the method comprising the steps of:

coupling a source or receiver of electrical energy to a piezoelectric crystal having a concave active surface and an acoustical impedance substantially larger than the interrogated object; and coupling ultrasonic energy between the active surface of the crystal and the surface of the object through a layer of material filling the concavity of the crystal and forming a flat surface facing away from the concave surface of the crystal, the acoustical impedance of the material being between that of the crystal and that of the object but substantially different from both, and the sonic velocity of the material being near that of the object.

* * * * *

UNITED STATES PATENT AND TRADEMARK OFFICE

CERTIFICATE OF CORRECTION

PATENT NO. : 4,184,094

DATED : January 15, 1980

INVENTOR(S) : LeRoy Kopel

It is certified that error appears in the above-identified patent and that said Letters Patent are hereby corrected as shown below:

Column 2, line 17, "an" should be --An--;
line 26, after "other" first occurrence insert --end to the other--.
Column 3, line 4, after "and" insert --a--;
line 59, "insteand" should be --instead--.

Signed and Sealed this

*Fifth* Day of *August 1980*

[SEAL]

*Attest:*

SIDNEY A. DIAMOND

*Attesting Officer* *Commissioner of Patents and Trademarks*